(12) United States Patent
Fairbanks

(10) Patent No.: US 7,215,142 B1
(45) Date of Patent: May 8, 2007

(54) MULTI-STAGE INVERSE TOGGLE

(75) Inventor: Scott Fairbanks, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/304,002

(22) Filed: Dec. 13, 2005

(51) Int. Cl.
    G06F 7/60 (2006.01)
(52) U.S. Cl. .................. 326/55; 341/121; 341/113
(58) Field of Classification Search ............... 326/52, 326/54, 55, 104, 113; 341/100, 101
    See application file for complete search history.

(56) References Cited

U.S. PATENT DOCUMENTS

| | | | | |
|---|---|---|---|---|
| 5,861,762 | A * | 1/1999 | Sutherland | 326/55 |
| 6,188,263 | B1 * | 2/2001 | Uenishi | 327/313 |
| 6,304,125 | B1 * | 10/2001 | Sutherland | 327/295 |
| 6,573,758 | B2 * | 6/2003 | Boerstler et al. | 326/113 |
| 6,987,402 | B2 * | 1/2006 | Lee et al. | 326/104 |
| 2004/0246028 | A1 * | 12/2004 | Lee et al. | 326/104 |

OTHER PUBLICATIONS

Ivan E. Sutherland, "Micropipelines", Communications of the ACM, Jun. 1989, vol. 32, No. 6.

Ivan Sutherland and Scott Fairbanks, GasP: A Minimal FIFO Control, © 2001 IEEE, no month.

Stanley Schuster, William Reohr, Peter Cook, David Heidel, Michael Immediato, Keith Jenkins, WA 17.3 Asynchronous Interlocked Pipelined CMOS Circuits Operating at 3.3-4.5GHz, 2000 IEEE International Solid-State Circuits Conference 07803-5853-8/00 © 2000 IEEE, no month.

* cited by examiner

*Primary Examiner*—Linh V. Nguyen
(74) *Attorney, Agent, or Firm*—Martine Penilla & Gencarella, LLP

(57) ABSTRACT

An inverse toggle circuit includes a pair of input connections for receiving each of four possible input signal combinations in a sequential rotational manner. Each of four data paths are defined to be exercised in accordance with a respective input signal combination. A first output connection is controlled by first and third data paths. A second output connection is controlled by second and fourth data paths. Each data path is defined such that a currently exercised data path generates an output signal having an asserted state on the output connection that is controlled by the currently exercised data path. The currently exercised data path is also defined to cause a next data path in the sequence to generate an output signal having a non-asserted state on the output connection that is controlled by the next data path.

20 Claims, 6 Drawing Sheets

|  | A | B | at | af | bt | bf |
|---|---|---|---|---|---|---|
| Path A Asserted | 0 | 0 | 0 | 1 | 0 | 1 |
| Path B Asserted | 1 | 0 | 1 | 0 | 0 | 1 |
| Path C Asserted | 1 | 1 | 1 | 0 | 1 | 0 |
| Path D Asserted | 0 | 1 | 0 | 1 | 1 | 0 |
Fig. 3
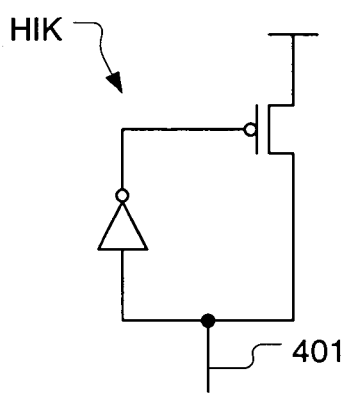
Fig. 4
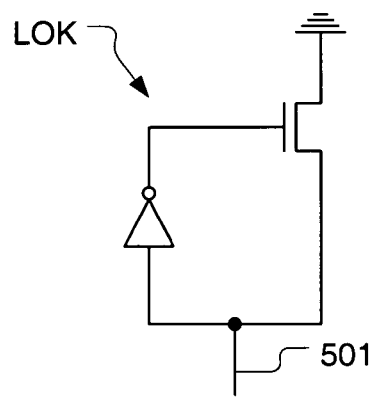
Fig. 5

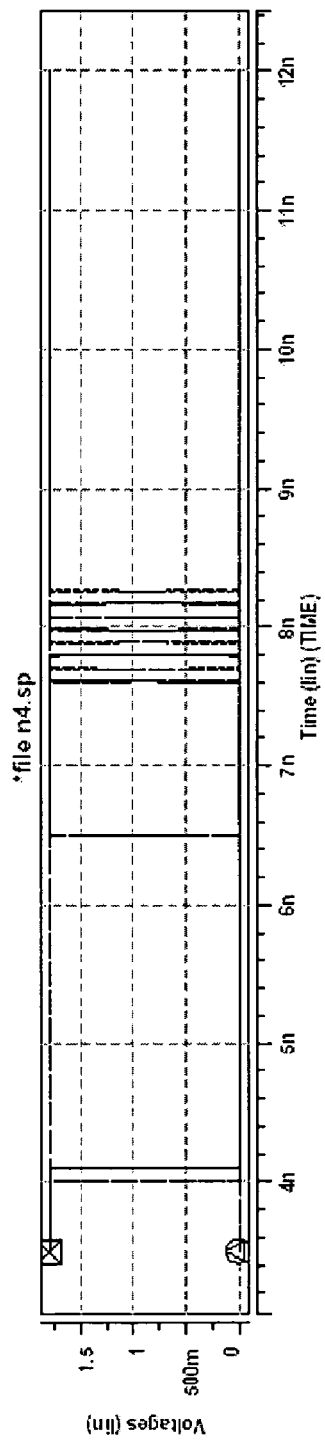
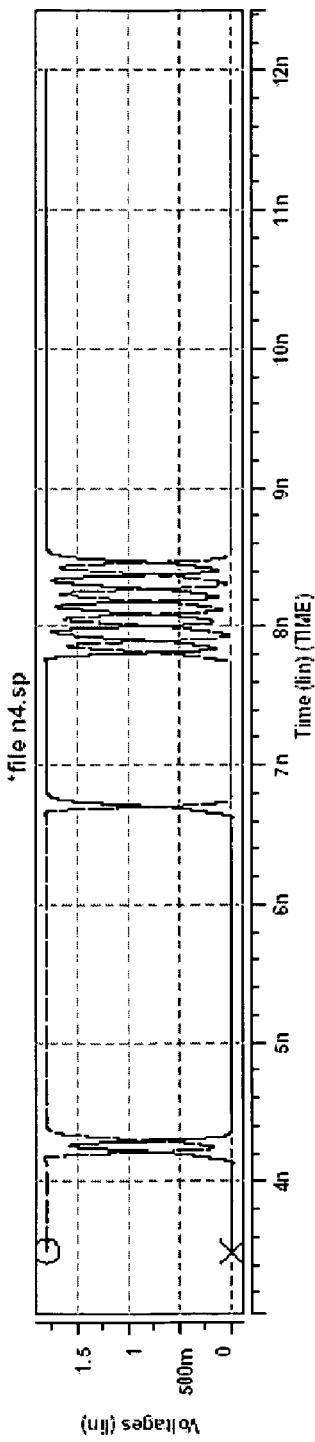
Fig. 6A
Fig. 6B

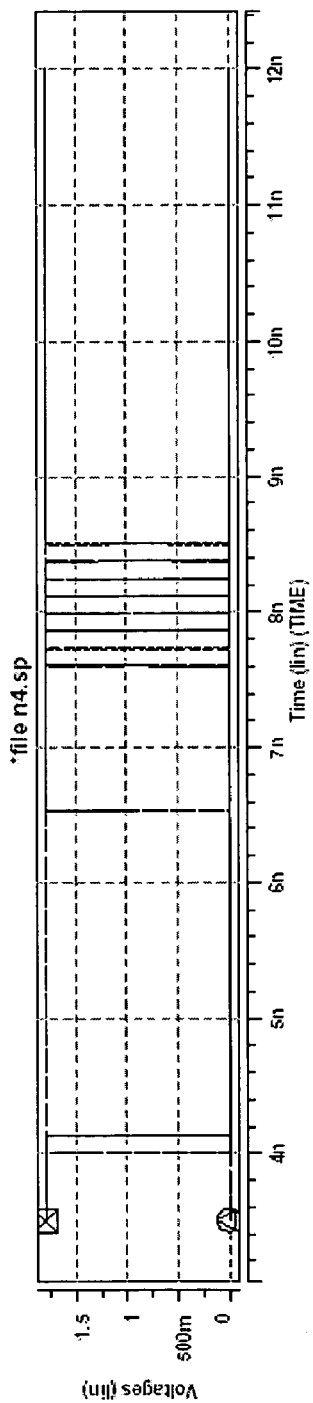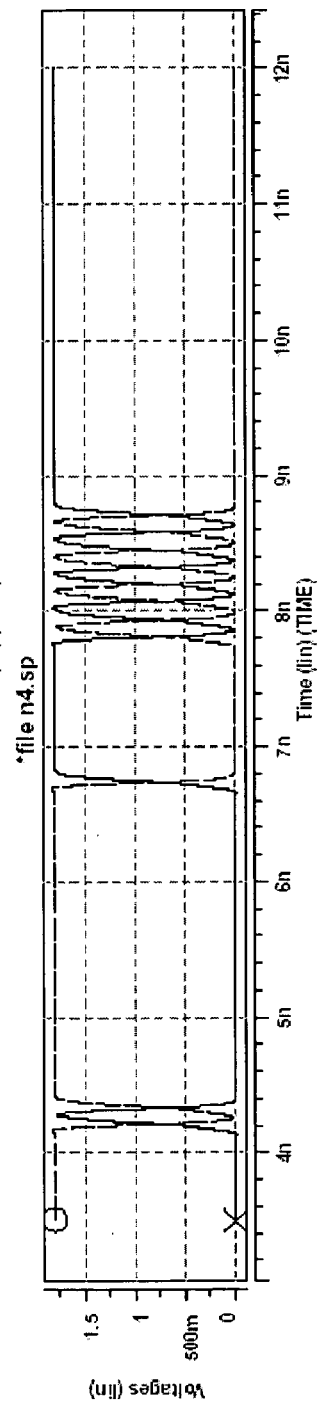
Fig. 7A
Fig. 7B

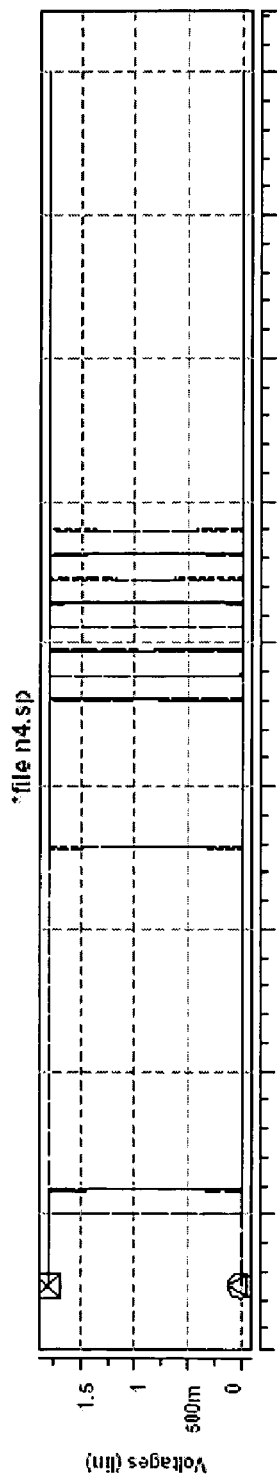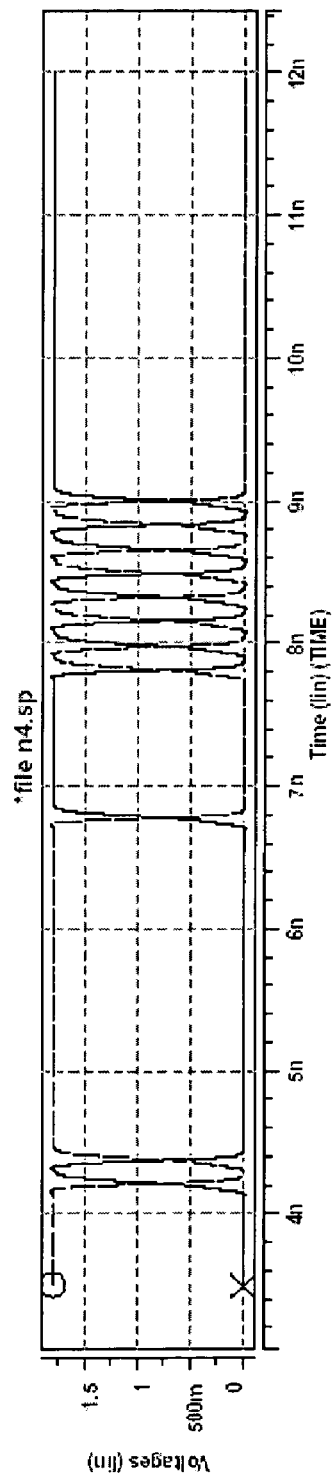

MULTI-STAGE INVERSE TOGGLE

GOVERNMENT LICENSE RIGHTS

The U.S. Government has a paid-up license in this invention and the right in limited circumstances to require the patent owner to license others on reasonable terms as provided for by the terms of Contract No. NBCH3039002 awarded by the Defense Advanced Research Projects Administration (DARPA).

BACKGROUND

A toggle is a gate that steers events received at a single input alternately to two outputs. An inverse toggle receives input events alternately on two inputs and generates output events in response to each alternating input. When considering the output which results from a given input, the function of the inverse toggle gate is equivalent to that of an exclusive-or (XOR) gate. However, as opposed to the XOR gate, the environment of an inverse toggle gate is constrained such that its two inputs alternate. Thus, an inverse toggle gate can be used in situations where an XOR logic function is needed and the environment is such that the two inputs to the XOR gate alternate.

Logical effort describes the computational complexity of a logic function. As those skilled in the art will appreciate, the XOR gate represents a burdensome logic function in terms of logical effort. For example, while logical efforts for an input of a NAND function and a NOR function are 4/3 and 5/3, respectively, the logical effort for an input of the XOR function is 4. Also, it should be appreciated that the logical effort directly correlates with a rate at which a logic gate implementing the logic function can be exercised, i.e., a bandwidth capability of the logic gate. Therefore, because the XOR gate has a relatively large logical effort value, the bandwidth of the XOR gate suffers accordingly.

SUMMARY

In one embodiment, an inverse toggle circuit is disclosed. The inverse toggle circuit includes a pair of input connections for receiving each of four possible input signal combinations in a fixed sequence and rotational manner. Four data paths are also provided in the inverse toggle circuit. Each of the four data paths is defined to be exercised in accordance with a respective one of the four possible input signal combinations to be received at the pair of input connections. Therefore, each data path is to be exercised in a fixed sequence and rotational manner according to receipt of its respective input signal combination. The inverse toggle also includes a first output connection and a second output connection. The first output connection is defined to be controlled by a first data path and a third data path to be exercised in the fixed sequence. The second output connection is defined to be controlled by a second data path and a fourth data path to be exercised in the fixed sequence. Each data path is defined such that a currently exercised data path generates an output signal having an asserted state on the output connection defined to be controlled by the currently exercised data path. Each data path is further defined such that the currently exercised data path causes a next data path in the fixed sequence to generate an output signal having a non-asserted state on the output connection defined to be controlled by the next data path in the fixed sequence.

In another embodiment, an inverse toggle circuit is disclosed. The inverse toggle includes a first data path, a second data path, a third data path, and a fourth data path. The first data path is defined to drive an assertion signal on a first output connection upon detection of an input state uniquely associated with the first data path. The first data path is further defined to cause the second data path to drive a non-assertion signal on a second output connection upon detection of the input state uniquely associated with the first data path. The second data path is defined to drive an assertion signal on the second output connection upon detection of an input state uniquely associated with the second data path. The second data path is further defined to cause the third data path to drive a non-assertion signal on the first output connection upon detection of the input state uniquely associated with the second data path. The third data path is defined to drive an assertion signal on the first output connection upon detection of an input state uniquely associated with the third data path. The third data path is further defined to cause the fourth data path to drive a non-assertion signal on the second output connection upon detection of the input state uniquely associated with the third data path. The fourth data path is defined to drive an assertion signal on the second output connection upon detection of an input state uniquely associated with the fourth data path. The fourth data path is further defined to cause the first data path to drive a non-assertion signal on the first output connection upon detection of the input state uniquely associated with the fourth data path.

In another embodiment, a method is disclosed for implementing an inverse toggle function. The method includes detecting a currently asserted input state provided to the inverse toggle gate and generating a pair of complementary inverse toggle output signals in response to detection of the currently asserted input state. Generating the pair of complementary inverse toggle output signals causes each of the inverse toggle output signals to represent a changed state. Furthermore, generating the pair of complementary inverse toggle output signals in response to detecting the currently asserted input state is accomplished by spreading an electrical effort of the inverse toggle gate over multiple stages. Spreading of the electrical effort over multiple stages allows for a reduction in logical complexity within the multiple stages, such that RC time constant values associated with nodes within the multiple stages are reduced. The reduction in RC time constant enables the nodes to be exercised at an increased rate.

Other aspects of the invention will become apparent from the following detailed description, taken in conjunction with the accompanying drawings, illustrating by way of example the principles of the invention.

BRIEF DESCRIPTION OF THE DRAWINGS

FIG. 3 is an illustration showing a table that summarizes the states of NMOS control signals "at", "af", "bt", and "bf" when the input signals combine to represent each of the four possible input states (0/0, 1/0, 1/1, 0/1), in accordance with one embodiment of the present invention;

FIG. 4 is an illustration showing the half-HI-keeper, in accordance with one embodiment of the present invention;

FIG. 5 is an illustration showing the half-LO-keeper, in accordance with one embodiment of the present invention;

FIGS. 6A and 6B show results of an inverse toggle simulation that used an input event spacing of 91 ps, in accordance with one embodiment of the present invention;

FIGS. 7A and 7B show results of an inverse toggle simulation that used an input event spacing of 125 ps, in accordance with one embodiment of the present invention; and FIGS. 8A and 8B show results of an inverse toggle simulation that used an input event spacing of 167 ps, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

Figure 1:
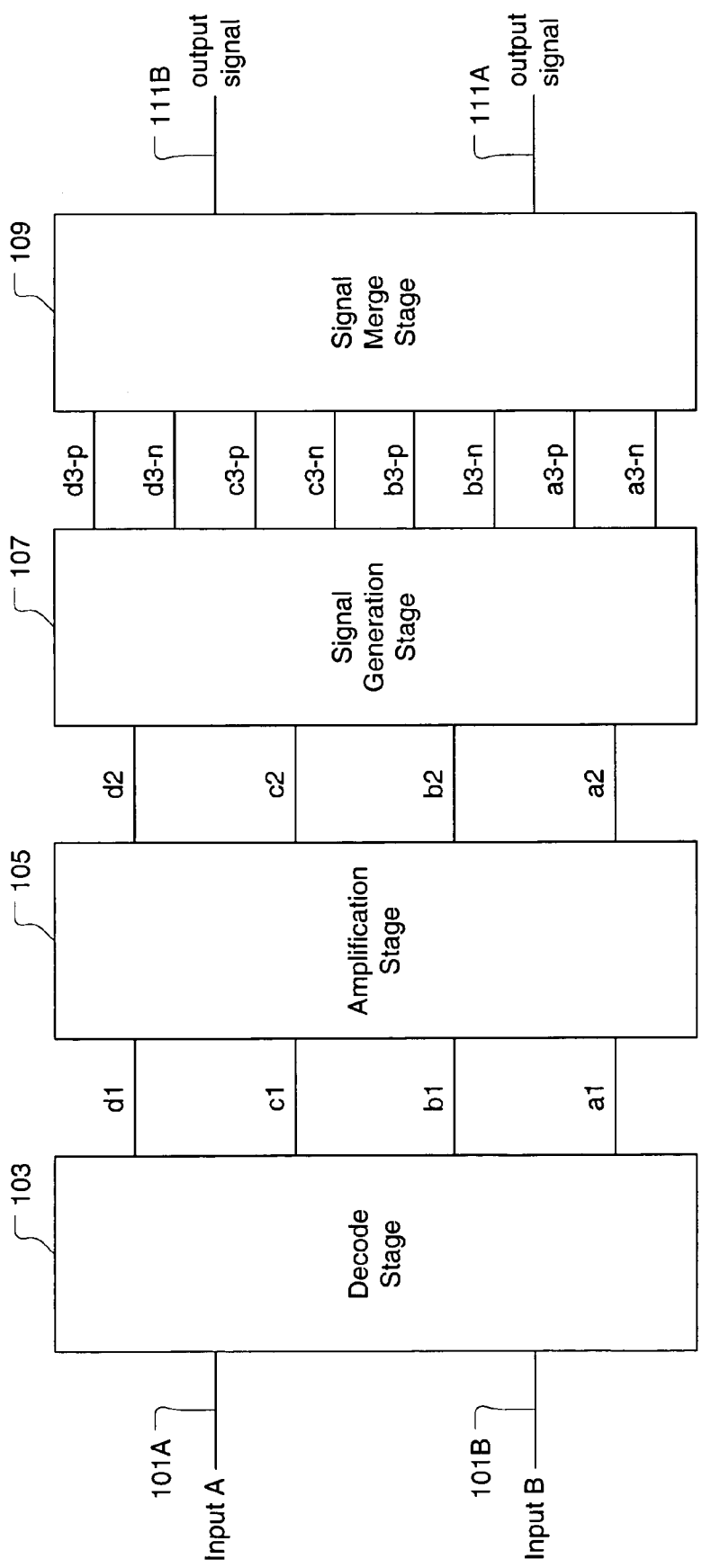
FIG. 1 is an illustration showing an inverse toggle architecture, in accordance with one embodiment of the present invention.

FIG. 1 is an illustration showing an inverse toggle architecture, in accordance with one embodiment of the present invention. The inverse toggle includes a decode stage 103, an amplification stage 105, a signal generation stage 107, and a signal merge stage 109. The decode stage 103 is defined to receive a pair of input signals 101A and 101B. When considered together, the pair of input signals 101A and 101B can represent either of four possible input states, i.e., 0/0, 1/0, 1/1, 0/1. The decode stage 103 is defined to detect which of the four possible input states is being asserted at a given instance by the input signals 101A and 101B.

Four data paths extend from the decode stage 103, through the amplification stage 105, through the signal generation stage 107, through the signal merge stage 109, to the output of the inverse toggle. Each of the four data paths corresponds to a respective one of the four possible input states. Therefore, the signals that are present on a particular data path are dependent upon whether the input state associated with the particular data is being asserted or not. For discussion purposes, consider that data path (a) corresponds to input state 0/0, data path (b) corresponds to input state 1/0, data path (c) corresponds to input state 1/1, and data path (d) corresponds to input state 0/1.

If input state 0/0 is asserted by the input signals 101A and 101B, the decode stage 103 will detect input state 0/0 and generate an assertion signal on a decode stage output node (a1). At the same time, the decode stage 103 will generate a non-assertion signal on decode stage output node (d1), corresponding to data path (d). If input state 1/0 is asserted by the input signals 101A and 101B, the decode stage 103 will detect input state 1/0 and generate an assertion signal on decode stage output node (b1). At the same time, the decode stage 103 will generate a non-assertion signal on decode stage output node (a1). If input state 1/1 is asserted by the input signals 101A and 101B, the decode stage 103 will detect input state 1/1 and generate an assertion signal on decode stage output node (c1). At the same time, the decode stage 103 will generate a non-assertion signal on decode stage output node (b1). If input state 0/1 is asserted by the input signals 101A and 101B, the decode stage 103 will detect input state 0/1 and generate an assertion signal on decode stage output node (d1). At the same time, the decode stage 103 will generate a non-assertion signal on decode stage output node (c1).

The amplification stage 105 is defined to buffer the signals present on decode stage output nodes (a1), (b1), (c1), and (d1). The buffered signals for decode stage output nodes (a1), (b1), (c1), and (d1) are present on amplification stage output nodes (a2), (b2), (c2), and (d2), respectively.

The signal generation stage 107 is defined to generate both a first control signal and a second control signal for each data path. Thus, the signal generation stage 107 is defined to generate four pairs of control signals, wherein each pair of control signals is based on a signal present at a respective amplification stage output node. For example, control signals generated on nodes (a3-$p$) and (a3-$n$) are based on the signal present at amplification stage output node (a2). Control signals generated on nodes (b3-$p$) and (b3-$n$) are based on the signal present at amplification stage output node (b2). Control signals generated on nodes (c3-$p$) and (c3-$n$) are based on the signal present at amplification stage output node (c2). Control signals generated on nodes (d3-$p$) and (d3-$n$) are based on the signal present at amplification stage output node (d2). Each of the first control signals on nodes (a3-$p$), (b3-$p$), (c3-$p$), and (d3-$p$) is defined to control a respective PMOS device within their respective data path in the signal merge stage 109. Each of the second control signals on nodes (a3-$n$), (b3-$n$), (c3-$n$), and (d3-$n$) is defined to control a respective NMOS device within their respective data path in the signal merge stage 109.

The signal merge stage 109 is defined to generate a respective output signal for each data path based on the first and second control signals output from the signal generation stage 107 for the corresponding data path. Also, the signal merge stage 109 is defined to merge the output signals for the data path (a) and (c) to generate a first output signal 111A. The signal merge stage 109 is further defined to merge the output signals for the data paths (b) and (d) to generate a second output signal 111B. Together, the output signals 111A and 111B represent the inverse toggle output.

Figure 2:
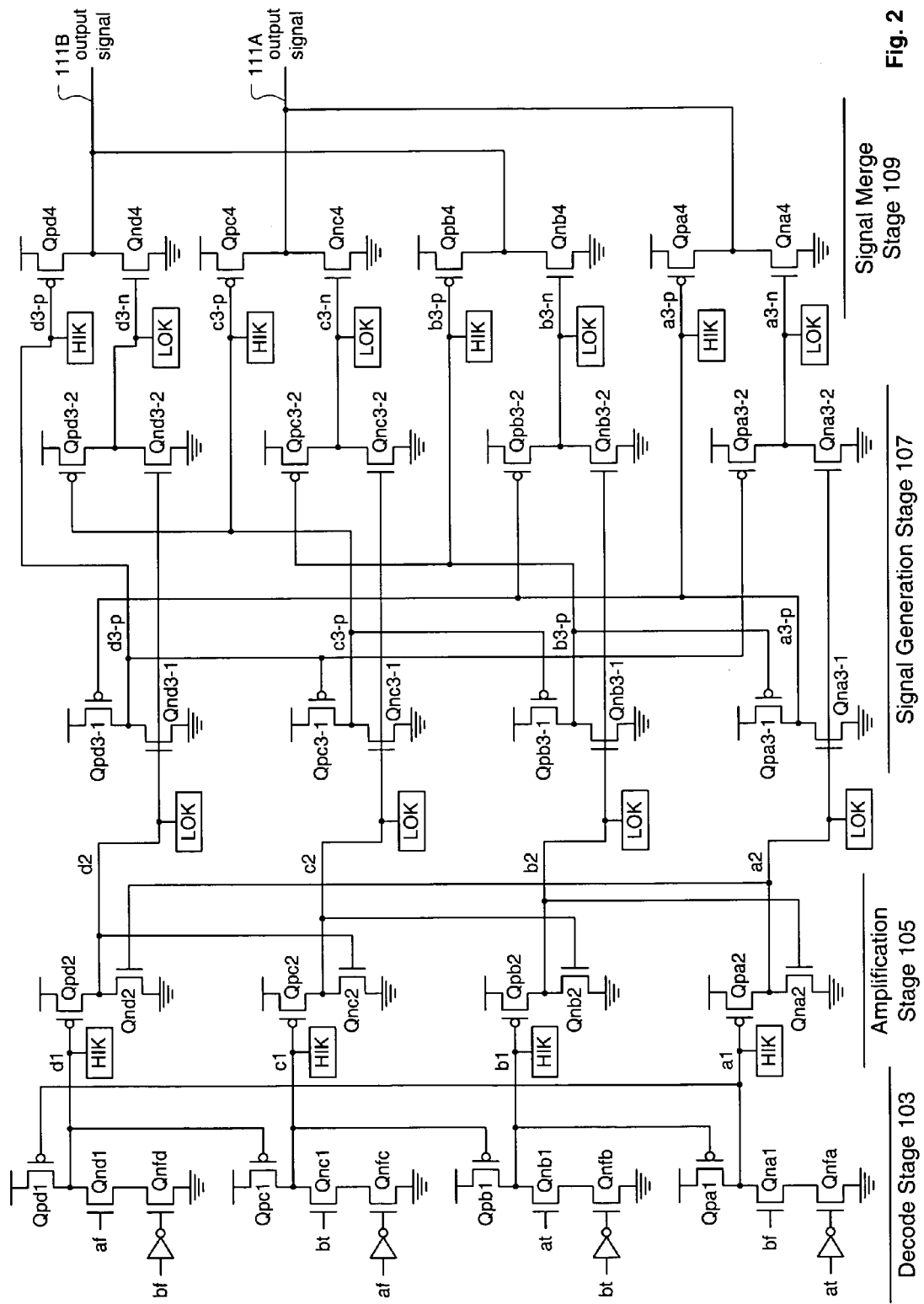
FIG. 2 is an illustration showing circuitry of the inverse toggle as previously described with respect to FIG. 1, in accordance with one embodiment of the present invention.

FIG. 2 is an illustration showing circuitry of the inverse toggle as previously described with respect to FIG. 1, in accordance with one embodiment of the present invention. The following naming convention is applied to the nodes and transistors presented in FIG. 2. Each transistor is identified with a capital "Q." The subscript for each transistor has three fields. A "p" in the first field identifies the transistor as a PMOS transistor. An "n" in the first field identifies the transistor as an NMOS transistor. The second field identifies in which of the four data paths, i.e., (a), (b), (c), (d), the transistor is located. The third field identifies in which of the four stages the transistor is located, wherein the four stages respectively are the decode stage 103, the amplification stage 105, the signal generation stage 107, and the signal merge stage 109. A fourth field is used in the signal generation stage 107, i.e., the third stage, to identify first and second PMOS and NMOS transistors.

Each node is identified with a letter and a number. The letter represents the data path within which the node resides. The number identifies the stage in which the node resides. The node identification in the signal generation stage 107, i.e., the third stage, includes an additional "n" or "p", wherein the "n" and "p" are designated if the node connects to the gate of an NMOS transistor and PMOS transistor, respectively, in the signal merge stage 109, i.e., the fourth stage.

The decode stage 103 (first stage), includes an NMOS "AND" logic stack. Each "AND" logic stack includes two serially connected NMOS transistors and a PMOS pull-up reset transistor. For example, in data path (a), the decode stage includes serially connected NMOS devices Qna1 and Qnfa and the PMOS pull-up reset transistor Qpa1. A similar arrangement of NMOS and PMOS transistors are shown to be defined in the decode stage 103 of each data path (b), (c), (d).

The logic implemented in the decode stage 103 detects which one of the four possible input states (0/0, 1/0, 1/1, 0/1) is asserted by the pair of input signals 101A and 101B at a particular instance. Detection of the asserted input state is facilitated by defining NMOS control signals based on the input signals 101A and 101B. The NMOS control signals are defined by implementing logic that evaluates whether or not each input signal 101A and 101B is true or false, wherein true refers to a particular input signal being asserted, i.e., "HI", "high", or "1", and false refers to a particular input signal being unasserted, i.e., "LO", "low", or "0." With regard to FIG. 2, the signals resulting from evaluation of whether input signal 101A is true and false are represented by "at" and "af", respectively. Similarly, the signals resulting from evaluation of whether input signal 101B is true and false are represented by "bt" and "bf", respectively. If input signal 101A is asserted, "at" will be asserted and "af" will be unasserted. If input signal 101A is unasserted, "at" will be unasserted and "af" will be asserted. If input signal 101B is asserted, "bt" will be asserted and "bf" will be unasserted. If input signal 101B is unasserted, "bt" will be unasserted and "bf" will be asserted.

FIG. 3 is an illustration showing a table that summarizes the states of NMOS control signals "at", "af", "bt", and "bf" when input signals 101A and 101B combine to represent each of the four possible input states (0/0, 1/0, 1/1, 0/1), in accordance with one embodiment of the present invention. When input signals 101A and 101B are 0 and 0, respectively, the NMOS transistors Qna1 and Qnfa are conducting and node (a1) is pulled LO. Thus, when input signals 101A and 101B are 0 and 0, respectively, data path (a) is exercised. When input signals 101A and 101B are 1 and 0, respectively, the NMOS transistors Qnb1 and Qnfb are conducting and node (b1) is pulled LO. Thus, when input signals 101A and 101B are 1 and 0, respectively, data path (b) is exercised. When input signals 101A and 101B are 1 and 1, respectively, the NMOS transistors Qnc1 and Qnfc are conducting and node (c1) is pulled LO. Thus, when input signals 101A and 101B are 1 and 1, respectively, data path (c) is exercised. When input signals 101A and 101B are 0 and 1, respectively, the NMOS transistors Qnd1 and Qnfd are conducting and node (d1) is pulled LO. Thus, when input signals 101A and 101B are 0 and 1, respectively, data path (d) is exercised.

The evaluated output of the decode stage 103 "AND" logic stack in the currently exercised data path is reset when the next input state is detected within the decode stage 103 of another data path. This reset is achieved by using the output of the decode stage 103 "AND" logic stack in the data path that detects the next asserted state of input signals 101A and 101B to control conduction of the PMOS pull-up reset transistor (Qpa1, Qpb1, Qpc1, Qpd1) in the currently exercised data path. For example, node (b1) controls PMOS pull-up reset transistor Qpa1, thus resetting the decode stage 103 "AND" logic stack in data path (a) HI when data path (b) is exercised. Therefore, considering that input signals 101A and 101B are asserted in a controlled sequence, i.e., 0/0, 1/0, 1/1, 0/1, each data path is exercised in a predictable order. As shown in FIGS. 2 and 3, the data paths are exercised in the order (a), (b), (c), (d), as the input states of the inverse toggle cycle, returning to exercising of data path (a) after all four data paths are exercised.

For the decode stage 103 to maintain the reset state, i.e., HI state, on each output node (a1, b1, c1, d1), a half-HI-keeper ("HIK") is connected to each output node (a1, b1, c1, d1). FIG. 4 is an illustration showing the half-HI-keeper, in accordance with one embodiment of the present invention. Each of nodes a1, b1, c1, and d1 is connected to a node 401 with a respective half-HI-keeper. It should be appreciated that circuit of FIG. 2 is not limited to the use of half-HI-keepers. For example, in another embodiment, one or more half-HI-keepers within the circuit of FIG. 2 can be replaced with a full-keeper, i.e., latch, without modifying the functionality of the circuit.

The amplification stage 105 (second stage) of each data path includes a PMOS transistor (Qpa2, Qpb2, Qpc2, Qpd2) driven by the output of the decode stage 103. The amplification stage 105 of each data path also includes an NMOS pull-down reset transistor (Qna2, Qnb2, Qnc2, Qnd2). The drain of each PMOS transistor Qpa2, Qpb2, Qpc2, Qpd2 drives HI when the controlling output node of the decode stage 103 (a1, b1, c1, d1, respectively) drives LO. The drain of each PMOS transistor Qpa2, Qpb2, Qpc2, Qpd2 represents the output nodes a2, b2, c2, d2, respectively, of the amplification stage 105.

In a manner similar to the decode stage 103, the amplification stage 105 output node of the currently exercised data path is reset when the next input state is detected within the decode stage 103 of another data path. This reset is achieved by using the output node of the amplification stage 105 in the data path that detects the next asserted state of input signals 101A and 101B to control conduction of the NMOS pull-down reset transistor (Qna2, Qnb2, Qnc2, Qnd2) in the currently exercised data path. For example, node (b2) controls NMOS pull-down reset transistor Qna2, thus resetting the amplification stage 105 output node (a2) in data path (a) LO when data path (b) is exercised.

For the amplification stage 105 to maintain the reset state, i.e., LO state, on each output node (a2, b2, c2, d2), a half-LO-keeper ("LOK") is connected to each output node (a2, b2, c2, d2). FIG. 5 is an illustration showing the half-LO-keeper, in accordance with one embodiment of the present invention. Each of nodes a2, b2, c2, and d2 is connected to a node 501 with a respective half-LO-keeper. It should be appreciated that circuit of FIG. 2 is not limited to the use of half-LO-keepers. For example, in another embodiment, one or more half-LO-keepers within the circuit of FIG. 2 can be replaced with a full-keeper, i.e., latch, without modifying the functionality of the circuit.

The signal generation stage 107 (third stage) of each data path includes two NMOS transistors that are each paired with a respective PMOS pull-up reset transistor. For example, in data path (a) the signal generation stage 107 includes NMOS transistors Qna3-1 and Qna3-2 that are respectively paired with PMOS transistors Qpa3-1 and Qpa3-2. The same type of NMOS-to-PMOS connectivity can be seen in data paths (b), (c), and (d). The gates of the two NMOS transistors in the signal generation stage 107 of each data path are driven together by the corresponding output of the amplification stage 105. For example, the gates of NMOS transistors Qna3-1 and Qna3-2 are driven together by output node (a2) of the amplification stage 103. Thus, the drains of each NMOS transistor in the signal generation stage 107 of a given data path are driven LO in unison. However, the drains each NMOS transistor in the signal generation stage 107 of a given data path return HI in response to different control signals, wherein these different control signals are driven by detection of different inverse toggle input states.

For ease of description, the signal generation stage 107 will be further described with respect to data path (b) which detects inverse toggle input state 1/0. It should be understood, however, that the signal generation stage 107 description provided for data path (b) is applicable to corresponding components within the signal generation stage 107 of data paths (a), (c), and (d). With respect to data path (b), there are two outputs generated by the signal generation stage 107. One of these two outputs (b3-*p*) is used to control a PMOS transistor (Qpb4) in the signal merge stage 109 (fourth stage) of data path (b). The other of these two outputs (b3-*n*) is used to control an NMOS transistor (Qnb4) in the signal merge stage 109 of data path (b).

The output (b3-*p*) generates a signal that is LO for one of the four inverse toggle input states, i.e., input signals 101A and 101B equal to either 0/0, 1/0, 1/1, or 0/1. The output (b3-*n*) generates a signal that is HI for one of the four inverse toggle input states. The signal widths generated on outputs (b3-*p*) and (b3-*n*) are achieved by the choice of node that controls the gate of the respective PMOS transistor that resets the drain of the associated NMOS transistor to HI. For example, the signal width on output (b3-*p*) is achieved by connecting node (c3-*p*) to control the gate of PMOS transistor (Qpb3-1) that resets the drain of NMOS transistor (Qnb3-1) to HI. Also, the signal width on output (b3-*n*) is achieved by connecting node (a3-*p*) to control the gate of PMOS transistor (Qpb3-2) that resets the drain of NMOS transistor (Qnb3-2) to HI. Thus, the signal width on output (b3-*p*) is achieved by resetting output (b3-*p*) to HI when the next inverse toggle input state is detected by the next data path, i.e., data path (c). Similarly, the signal width on output (b3-*n*) is achieved by resetting output (b3-*n*) to HI when the previous inverse toggle input state is detected by the previous data path, i.e., data path (a).

In accordance with the foregoing, when the NMOS transistor (Qnb3-2) connected to (b3-*n*) pulls LO, it is in contention with conducting PMOS transistor (Qpb3-2) for almost two gate delays. The conducting PMOS transistor (Qpb3-2) is turned off when node (a3-*p*) in data path (a) returns HI. Node (a3-*p*) returns HI when node (b3-*p*) is driven LO. It should be appreciated that NMOS transistor (Qnb3-2) is able to pull node (b3-*n*) sufficiently LO within the above-mentioned almost two gate delay period to essentially turn off the NMOS transistor (Qnb4) in the signal merge stage 109.

Each output (a3-*n*, b3-*n*, c3-*n*, d3-*n*) of the signal generation stage 107, that drives a respective NMOS transistor (Qna4, Qnb4, Qnc4, Qnd4) gate in the signal merge stage 109, is connected to a respective half-LO-keeper. Also, each output (a3-*p*, b3-*p*, c3-*p* d3-*p* of the signal generation stage 107, that drives a respective PMOS transistor (Qpa4, Qpb4, Qpc4, Qpd4) gate in the signal merge stage 109, is connected to a respective half-HI-keeper.

The signal merge stage 109 (fourth stage) of each data path includes an NMOS transistor and a PMOS transistor that share a common drain. For example, in data path (a), the signal merge stage 109 includes NMOS transistor (Qna4) and PMOS transistor (Qpa4) which share a common drain. Each of the PMOS transistors (Qpa4, Qpb4, Qpc4, Qpd4) function to pull their drain HI when their respective data path is exercised. Each of the NMOS transistors (Qna4, Qnb4, Qnc4, Qnd4) function to pull their drain LO when the next data path is exercised. Also in the signal merge stage 109, the drain of data path (a) transistors (Qpa4 and Qna4) is connected to the drain of data path (c) transistors (Qpc4 and Qnc4) to provide the output signal 111A of the inverse toggle. Similarly in the signal merge stage 109, the drain of data path (b) transistors (Qpb4 and Qnb4) is connected to the drain of data path (d) transistors (Qpd4 and Qnd4) to provide the output signal 111B of the inverse toggle.

It should be appreciated that only one of the four transistors (Qpa4, Qna4, Qpc4, Qnc4) connected to provide the inverse toggle output signal 111A is driving at a given instance. Also, only one of the four transistors (Qpb4, Qnb4, Qpd4, Qnd4) connected to provide the inverse toggle output signal 111B is driving at a given instance. Additionally, none of the transistors in the signal merge stage 109 are connected in series. The inverse toggle function requires that at least four conduction paths share a common node, assuming that a signal on a conduction path is not generated passively by a complement function. In view of this requirement, to obtain the smallest RC value at the shared common node, the present invention utilizes four non-series transistors to drive the shared common node, wherein one of the four non-series transistors is active for one of four input durations.

A well-designed inverse toggle exploits the deterministic sequence of input transitions to reduce its logic effort and allow it to be exercised at a higher rate than possible with an XOR gate. The inverse toggle of the present invention implements a number of strategies to provide increase bandwidth through the inverse toggle. One of these strategies is referred to as a buffer strategy. In the buffer strategy, the inverse toggle predictably cycles through four input states presented on input signals 10A and 101B, i.e., 0/0, 1/0, 1/1, 0/1, as previously described with respect to FIG. 3. Each of the four input states is detected by two series NMOS transistors in the decode stage 103. For example, in data path (a), NMOS transistors (Qna1 and Qnfa) represent the two series NMOS transistors in the decode stage 103, wherein NMOS transistor (Qna1) is referred to as the head transistor and NMOS transistor (Qnfa) is referred to as the foot transistor. Because of environmental constraints on the inverse toggle, it is possible to know which of input signals 101A and 101B arrives last at the inverse toggle.

Some delay occurs during the time period extending from arrival of the first input signal 101A to arrival of the second input signal 101B. This delay is used to buffer the assertion signal (at) to the foot transistor (Qnfa) which has its source connected to ground. The foot transistor (Qnfa) is a wide series transistor that is sized larger than the head transistor (Qna1). The inverter that drives the gate of the foot transistor (Qnfa) is sized to include transistor widths equal to the size of the foot transistor (Qnfa) divided by a chosen stage effort of the inverse toggle system. For example, if the foot transistor (Qnfa) is sized twice as large as the head transistor (Qna1) and the stage effort for the system is three, the input capacitance on the input of the inverter driving the foot transistor (Qnfa) is two-thirds (⅔) that of the head transistor (Qna1), and the resistance of the NMOS pull-down stack (defined by Qna1 and Qnfa) is three-fourths (¾) of the resistance associated with having identical transistors (Qna1 and Qnfa). It should also be appreciated that three gate delays provides sufficient time for the wide series foot transistor (Qnfa) to be fully conducting when the assertion signal (bf) arrives at the head transistor (Qna1). It should be further appreciated that the above discussion provided with respect to the decode stage 103 of data path (a) is equally applicable to the decode stage 103 of data paths (b), (c), and (d).

Another strategy associated with the inverse toggle of the present invention is referred to as a post-charge reset strategy. In the post-charge reset strategy, logic in the decode stage (103) is used to detect which of the four inverse toggle input states is asserted on a corresponding data path. Once the asserted inverse toggle input state is detected, the decode stage 103 output node (a1, b1, c1, d1) of the corresponding data path is driven LO. Rather than load the inputs of the decode stage 103 with PMOS logic necessary to reset the outputs of the decode stage 103, the outputs of the decode stage 103 are reset HI when the inputs of the decode stage 103 indicate assertion of the next inverse toggle input state. Because the particular data path in the decode stage 103 that will detect the next inverse toggle input state is known, it is possible to use the decode stage 103 output from the particular data path to control a PMOS pull-up transistor to reset the decode stage 103 output of the data path that was previously pulled LO. Therefore, it should be appreciated that the decode stage 103 output of a currently exercised data path is used to reset the decode stage 103 output of a previously exercised data path. Also, it should be appreciated that the same reset strategy as described above for the decode stage 103 output is also applied to the amplification stage 105 output.

Another strategy associated with the inverse toggle of the present invention is referred to as a spread strategy. The spread strategy corresponds to spreading the logic of the inverse toggle over four stages, i.e., the decode stage 103, the amplification stage 105, the signal generation stage 107, and the signal merge stage 109. Detection of the asserted inverse toggle input state is performed in the decode stage 103 (first stage). The amplification stage 105 (second stage) buffers the output of the decode stage 103 in route to the signal generation stage 107 (third stage). The buffering provided by the amplification stage 105 compensates for the lower electrical capability of the PMOS transistors. The signal generation stage 107 (third stage) utilizes more electrically capable NMOS transistors. The signal generation stage 107 generates two signals necessary to implement the final logic function of the inverse toggle, wherein the two signals are used to control a respective NMOS and PMOS transistor in the signal merge stage 109 (fourth stage). The signal merge stage 109 functions to merge the signals generated on eight output nodes of the signal generation stage 107 into two inverse toggle output signals 111A and 111B.

It should be appreciated that the work load of the inverse toggle could be spread further in another embodiment by adding a stage between the signal generation stage 107 and the signal merge stage 109. For example, connecting each output node of the signal generation stage 107 to a respective inverter en route to the signal merge stage 109 could lighten some of the electrical load on the signal generation stage 107 and provide more amplification to drive the signal merge stage 109. The inverters connected to the output nodes of the signal merge stage 107 in this embodiment would also enable shaping of the signals used to drive the signal merge stage 109. For example, the NMOS/PMOS ratio of the inverters connected to the output nodes of the signal merge stage 107 in this embodiment could be altered to hasten the turning on or off of particular transistors in the signal merge stage 109. Additionally, in another embodiment, a stage similar to the amplification stage 105 could be inserted between the signal generation stage 107 and the signal merge stage 109.

The inverse toggle is often used in an asynchronous computing environment. In such an environment, the inverse toggle must be capable of generating clean signals when exercised at a continuous high frequency, and when reacting to a burst of input signals following long periods of inactivity. A number of simulations were performed to demonstrate the performance of the inverse toggle of the present invention. In these simulations, the inverse toggle was required to drive a load corresponding to a 96 μm (micrometer) wide transistor representative of a 32-bit data path. Each electrical input to the inverse toggle was driven by an inverter having 2 μm of total gate width and a p/n width ratio of two. Linear voltage generators were used to generate the input events for the inverse toggle.

FIGS. 6A and 6B show results of an inverse toggle simulation that used an input event spacing of 91 ps (picoseconds), in accordance with one embodiment of the present invention. FIGS. 7A and 7B show results of an inverse toggle simulation that used an input event spacing of 125 ps, in accordance with one embodiment of the present invention. FIGS. 8A and 8B show results of an inverse toggle simulation that used an input event spacing of 167 ps, in accordance with one embodiment of the present invention.

FIGS. 6A, 7A, and 8A show the waveforms generated by the voltage generators at the inputs of the inverse toggle. Initially, each voltage generator issues a single transition. This single transition should result in a signal from the output of the inverse toggle having a width approximately equal to the delay between the input events sent to the inverse toggle. Then, following a period of inactivity that is sufficient for all voltages to restore to the supply or ground, as appropriate, a single transition is sent to the inputs of the inverse toggle. Then, following another period of inactivity that is sufficient for all voltages to restore to the supply or ground, as appropriate, eight transitions are sent to the inputs of the inverse toggle. The transitions at the inputs of the inverse toggle reveal how the inverse toggle gate acts under different modes of operation, i.e., a signal, a single event, or a steady stream of events.

FIGS. 6B, 7B, and 8B show the output of the inverse toggle associated with the input events depicted in FIGS. 6A, 7A, and 8A, respectively. As previously mentioned, FIGS. 6A/6B, 7A/7B, and 8A/8B correspond to periods of 91 ps, 125 ps, and 167 PS, respectively, between the edges of the two inverse toggle inputs that cause the signal and the steady stream of events. As shown in FIGS. 6B, 7B, and 8B, the inverse toggle is capable of generating discernable signal outputs with an input event spacing as short as 91 ps. With a longer event spacing, e.g., 167 PS, the signal output from the inverse toggle becomes even more well-defined. It should be appreciated, that the simulations presented herein are provided for descriptive purposes only. It should be understood that the inverse toggle of the present invention is not limited in any way to either the particular manner of use or corresponding results as presented with respect to the simulations of FIGS. 6A, 6B, 7A, 7B, 8A, and 8B.

In accordance with the foregoing description, the inverse toggle of the present invention is defined to spread an electrical effort of the inverse toggle over multiple stages, i.e., the decode stage 103, the amplification stage 105, the signal generation stage 107, and the signal merge stage 109. Spreading of the electrical effort over the multiple stages enables the RC time constant of nodes within the multiple stages to be small enough such that the nodes can be exercised at a high rate. Also, the inverse toggle configuration of the present invention provides for minimization of a capacitance associated with the inverse toggle output signals 111A and 111B. The minimized resistance through the data paths and minimized output capacitance results in a minimized RC time constant for the inverse toggle circuit. The minimized RC time constant enables the inverse toggle circuit to be exercised at an optimally fast rate.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An inverse toggle circuit, comprising:
a pair of input connections for receiving each of four possible input signal combinations in a fixed sequence and in a rotational manner;
four data paths defined to be exercised in accordance with a respective one of the four possible input signal combinations to be received at the pair of input connections such that each data path is to be exercised in a fixed sequence and in a rotational manner;
a first output connection defined to be controlled by a first data path and a third data path to be exercised in the fixed sequence; and
a second output connection defined to be controlled by a second data path and a fourth data path to be exercised in the fixed sequence,
wherein each data path is defined such that a currently exercised data path generates an output signal having an asserted state on the output connection defined to be controlled by the currently exercised data path, and the currently exercised data path causes a next data path in the fixed sequence to generate an output signal having a non-asserted state on the output connection defined to be controlled by the next data path in the fixed sequence.

2. An inverse toggle circuit as recited in claim 1, wherein the fixed sequence is defined so that the first data path is to be exercised, followed by the second data path, followed by the third data path, followed by the fourth data path, then repeating with the first data path.

3. An inverse toggle circuit as recited in claim 1, wherein each data path includes decode logic defined to detect receipt of the input signal combination that causes the data path to be exercised, the decode logic defined to generate a first signal indicating receipt of the input signal combination that causes the data path to be exercised.

4. An inverse toggle circuit as recited in claim 3, wherein the currently exercised data path is defined to reset the first signal in the previously exercised data path.

5. An inverse toggle circuit as recited in claim 3, wherein each data path includes amplification logic defined to generate a second signal in response to the first signal, the second signal representing an inverted version of the first signal.

6. An inverse toggle circuit as recited in claim 5, wherein the currently exercised data path is defined to reset the second signal in the previously exercised data path.

7. An inverse toggle circuit as recited in claim 5, wherein each data path includes signal generation logic defined to generate a pair of control signals in response to the second signal, the pair of control signals defined to direct generation of the output signal having an asserted state on the output connection defined to be controlled by the data path.

8. An inverse toggle circuit as recited in claim 7, wherein the currently exercised data path is defined to reset a first control signal of the pair of control signals in the previously exercised data path, and the currently exercised data path is defined to reset a second control signal of the pair of control signals in the next data path in the fixed sequence.

9. An inverse toggle circuit, comprising:
a first data path defined to drive an assertion signal on a first output connection upon detection of an input state uniquely associated with the first data path;
a second data path defined to drive an assertion signal on a second output connection upon detection of an input state uniquely associated with the second data path;
a third data path defined to drive an assertion signal on the first output connection upon detection of an input state uniquely associated with the third data path; and
a fourth data path defined to drive an assertion signal on the second output connection upon detection of an input state uniquely associated with the fourth data path,
wherein the first data path is further defined to cause the second data path to drive a non-assertion signal on the second output connection upon detection of the input state uniquely associated with the first data path,
wherein the second data path is further defined to cause the third data path to drive a non-assertion signal on the first output connection upon detection of the input state uniquely associated with the second data path,
wherein the third data path is further defined to cause the fourth data path to drive a non-assertion signal on the second output connection upon detection of the input state uniquely associated with the third data path, and
wherein the fourth data path is further defined to cause the first data path to drive a non-assertion signal on the first output connection upon detection of the input state uniquely associated with the fourth data path.

10. An inverse toggle circuit as recited in claim 9, wherein the inverse toggle circuit is defined to spread an electrical effort of each data path over multiple stages to reduce an RC time constant associated with nodes within each data path.

11. An inverse toggle circuit as recited in claim 9, wherein the inverse toggle circuit is defined to receive a sequence of input states defined as the input state uniquely associated with the first data path, followed by the input state uniquely associated with the second data path, followed by the input state uniquely associated with the third data path, followed by the input state uniquely associated with the fourth data path, followed by repetition of the sequence with the input state uniquely associated with the first data path.

12. An inverse toggle circuit as recited in claim 9, wherein each data path includes decode logic defined to detect receipt of the input state uniquely associated with the data path, the decode logic defined to generate a first signal within the data path, wherein the first signal indicates receipt of the input state uniquely associated with the data path.

13. An inverse toggle circuit as recited in claim 12, wherein the first signal within the first data path is transmitted to reset the first signal within the fourth data path, the first signal within the second data path is transmitted to reset the first signal within the first data path, the first signal within the third data path is transmitted to reset the first signal within the second data path, and the first signal within the fourth data path is transmitted to reset the first signal within the third data path.

14. An inverse toggle circuit as recited in claim 12, wherein each data path includes amplification logic defined to generate a second signal within the data path in response to the first signal within the data path, the second signal representing an inverted version of the first signal.

15. An inverse toggle circuit as recited in claim 14, wherein the second signal within the first data path is transmitted to reset the second signal within the fourth data path, the second signal within the second data path is transmitted to reset the second signal within the first data path, the second signal within the third data path is transmitted to reset the second signal within the second data path, and the second signal within the fourth data path is transmitted to reset the second signal within the third data path.

16. An inverse toggle circuit as recited in claim 14, wherein each data path includes signal generation logic defined to generate a pair of control signals within the data path in response to the second signal within the data path, the pair of control signals defined to direct driving of the assertion signal on the output connection associated with the data path.

17. An inverse toggle circuit as recited in claim 16, wherein a first control signal of the pair of control signals within the first data path is transmitted to reset a first control signal of the pair of control signals within the fourth data path and is transmitted to reset a second control signal of the pair of control signals within the second data path,
   wherein a first control signal of the pair of control signals within the second data path is transmitted to reset the first control signal of the pair of control signals within the first data path and is transmitted to reset a second control signal of the pair of control signals within the third data path,
   wherein a first control signal of the pair of control signals within the third data path is transmitted to reset the first control signal of the pair of control signals within the second data path and is transmitted to reset a second control signal of the pair of control signals within the fourth data path, and
   wherein the first control signal of the pair of control signals within the fourth data path is transmitted to reset the first control signal of the pair of control signals within the third data path and is transmitted to reset a second control signal of the pair of control signals within the first data path.

18. A method for implementing an inverse toggle function, comprising:
   detecting a currently asserted input state provided to the inverse toggle gate; and
   generating a pair of complementary inverse toggle output signals in response to detection of the currently asserted input state, wherein the generating causes each of the inverse toggle output signals to represent a changed state,
   wherein the generating in response to the detecting is accomplished by spreading an electrical effort of the inverse toggle gate over multiple stages to reduce a logical complexity in the multiple stages, wherein the reduced logical complexity enables a reduction in RC time constant on nodes within the multiple stages.

19. A method for implementing an inverse toggle function as recited in claim 18, wherein the currently asserted input state is one of four detectable input states asserted in a sequential rotational manner.

20. A method for implementing an inverse toggle function as recited in claim 18, wherein the reduction in RC time constant on nodes within the multiple stages enables the nodes to be exercised at an increased rate.

* * * * *